US009190548B2

(12) United States Patent
Graff et al.

(10) Patent No.: US 9,190,548 B2
(45) Date of Patent: Nov. 17, 2015

(54) METHOD OF CREATING TWO DIMENSIONAL DOPING PATTERNS IN SOLAR CELLS

(75) Inventors: John Graff, Swampscott, MA (US); Nicholas Bateman, Reading, MA (US); Joseph Olson, Beverly, MA (US); Benjamin Riordon, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 906 days.

(21) Appl. No.: 13/270,290

(22) Filed: Oct. 11, 2011

(65) Prior Publication Data

US 2013/0087189 A1     Apr. 11, 2013

(51) Int. Cl.
H01L 31/0224 (2006.01)
H01L 31/068 (2012.01)
H01L 21/266 (2006.01)
H01L 31/18 (2006.01)

(52) U.S. Cl.
CPC .......... *H01L 31/0682* (2013.01); *H01L 21/266* (2013.01); *H01L 31/022441* (2013.01); *H01L 31/1804* (2013.01); *H01J 2237/31711* (2013.01); *Y02E 10/547* (2013.01)

(58) Field of Classification Search
CPC .............. H01L 31/022441; H01L 31/1804
USPC ............................................. 136/256; 438/87
See application file for complete search history.

(56) References Cited

U.S. PATENT DOCUMENTS

| 6,184,111 | B1 | 2/2001 | Henley et al. |
| 7,727,866 | B2 | 6/2010 | Bateman et al. |
| 7,820,460 | B2 | 10/2010 | Sullivan et al. |
| 8,153,496 | B1 * | 4/2012 | Ramappa ............ 438/369 |
| 8,242,005 | B1 | 8/2012 | Ricci |
| 2008/0017243 | A1 | 1/2008 | De Ceuster et al. |
| 2009/0227095 | A1 | 9/2009 | Bateman et al. |
| 2011/0237022 | A1 | 9/2011 | Bateman et al. |
| 2013/0008494 | A1 | 1/2013 | Bateman et al. |

FOREIGN PATENT DOCUMENTS

| JP | 2009-152222 A * | 7/2009 | ............ H01L 31/04 |
| WO | 2011019828 A2 | 2/2011 | |
| WO | 2011049950 A1 | 4/2011 | |

OTHER PUBLICATIONS

Shibata, Takeshi, et al., Stencil Mask Ion Implantation Technology for Sub 100-nm Technology Node, Extended Abstracts of International Workshop on Junction Technology, 2001, pp. 1-3-1 to 1-3-4, Japan Society of Applied Physics.

* cited by examiner

*Primary Examiner* — Golam Mowla (57) ABSTRACT

An improved method of fabricating an interdigitated back contact (IBC) solar cell is disclosed. A first mask is used to perform a patterned ion implantation of n-type dopant to create the back surface field. A second mask is then used to create the p-type emitter on the same surface. The second mask may be aligned to the n-type implant, and may be used in a plurality of orientations to create the desired p-type emitter. In some embodiments, a p-type blanket implant is performed as well. In some embodiments, a doping gradient is created.

9 Claims, 7 Drawing Sheets

METHOD OF CREATING TWO DIMENSIONAL DOPING PATTERNS IN SOLAR CELLS

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Figure 1:
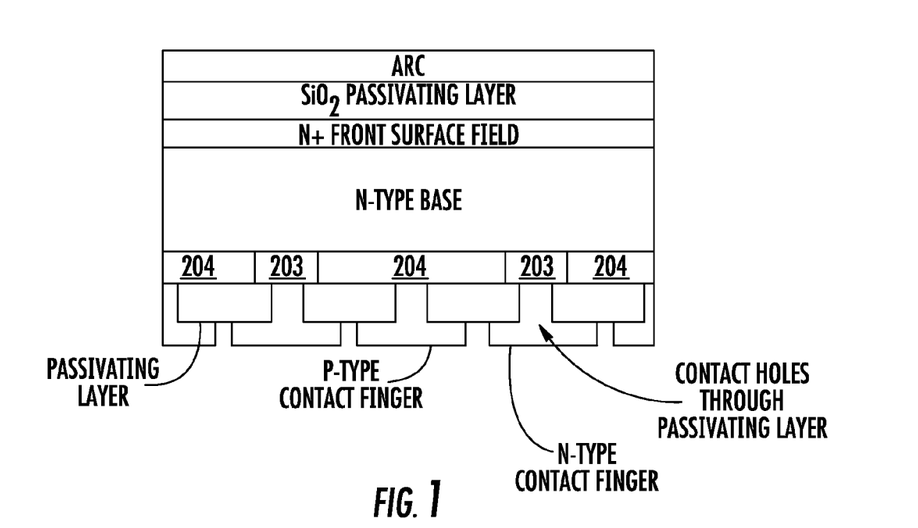
FIG. 1 is a cross-sectional view of an interdigitated back contact solar cell.
Figure 2:
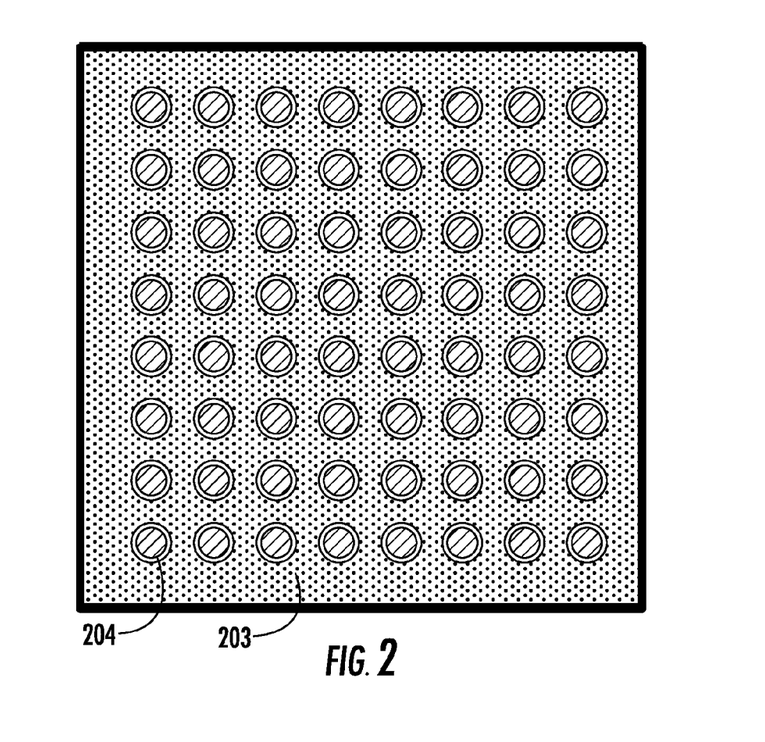
FIG. 2 is a bottom view of an interdigitated back contact solar cell.

Solar cells may require doping to improve efficiency. The dopant may be, for example, arsenic, phosphorus, or boron. FIG. 1 is a cross-sectional view of an interdigitated back contact (IBC) solar cell. In the IBC solar cell, the p-n junction is on the back side of the solar cell. In some embodiments, as shown in FIG. 2, the doping pattern may comprise a plurality of n-type dopant regions 204 distributed throughout a p-type dopant region 203. The p+ emitter 203 and the n+ back surface field 204 are appropriately doped. This doping may enable the junction in the IBC solar cell to function or have increased efficiency.

Typically, the dopant pattern shown in FIG. 2 is made using a hard mask, which is directly formed on the substrate. For example, a mask material may be applied to the entire substrate. The hard mask material then is patterned such that the mask material is removed only in those regions which are to be n-doped. The exposed areas can then be doped, using methods including diffusion, ion implantation, or other appropriate doping method. After the doping process is completed, the hard mask may be removed. If appropriate, this process could be repeated in order to form additional patterned doped regions on the substrate.

Note that the hard mask technique requires a substantial number of process steps (including forming the masking material, patterning the masking material, and removing the mask after the doping process. Therefore the hard mask method is time consuming and costly.

It would be beneficial if the formation of patterned doped regions can be made without direct application of material to the substrate. For example, it would be advantageous if this pattern could be created using only shadow masks.

SUMMARY

An improved method of implanting an interdigitated back contact (IBC) solar cell is disclosed. A first shadow mask is used to perform a patterned implant of n-type dopant to create the back surface field. A second mask is then used to create the p-type emitter on the same surface. The second mask may be aligned to the n-type implant, and may be used in a plurality of orientations to create the desired p-type emitter. In some embodiments, a p-type blanket implant is performed as well. In some embodiments, a doping gradient is created.

BRIEF DESCRIPTION OF THE DRAWINGS

For a better understanding of the present disclosure, reference is made to the accompanying drawings, which are incorporated herein by reference and in which.

DETAILED DESCRIPTION

Embodiments of this system are described herein in connection with solar cells. However, the embodiments of this system can be used with, for example, semiconductor wafers or flat panels. The implanter may be, for example, a beamline or plasma doping ion implanter. Thus, the invention is not limited to the specific embodiments described below.

Figure 3:
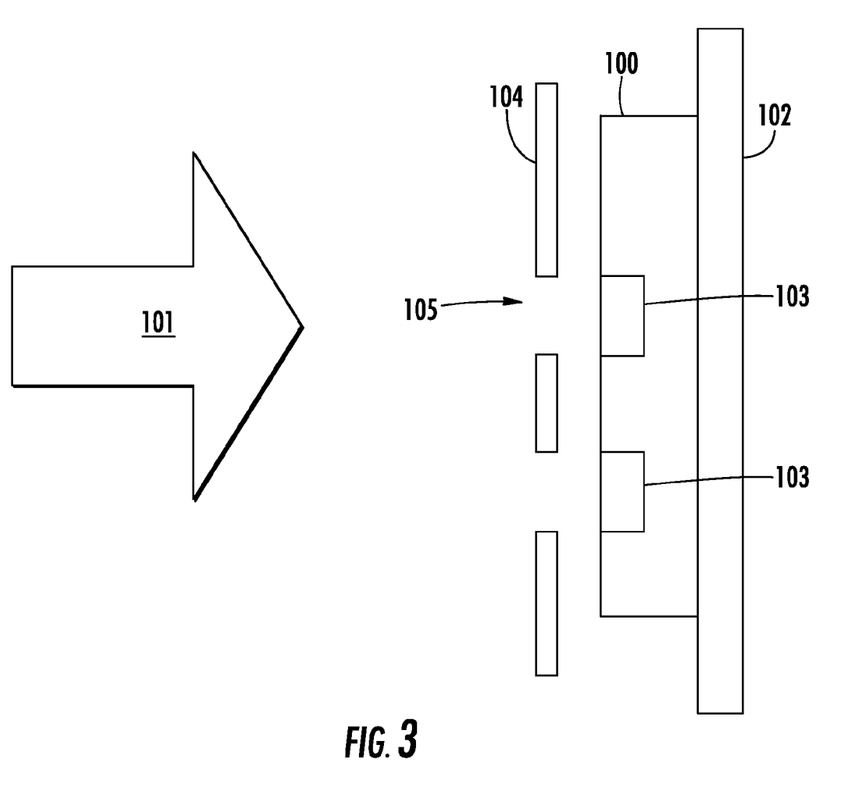
FIG. 3 is a cross-sectional view of implantation through a mask.

FIG. 3 is a cross-sectional view of implantation through a mask. When a specific pattern of ion implantation in a substrate 100 is desired, a mask 104 may be used. This mask 104 may be a shadow or proximity mask. The mask 104 is placed in front of and a distance away from a substrate 100 in the path of an ion beam 101. The substrate 100 may be, for example, a solar cell. The substrate 100 may be placed on a platen 102, which may use electrostatic or physical force to retain the substrate 100. The mask 104 has apertures 105 that correspond to the desired pattern of ion implantation in the substrate 100. The apertures 105 may be stripes, dots, or other shapes. Dopant atoms from the ion beam 101 may pass through the apertures 105 in the mask 104. Thus, only the implanted regions 103 are formed in the substrate. The implanted regions 103 may correspond to, for example, the n-type back surface field 204 in the IBC solar cell of FIG. 2.

Figure 4:
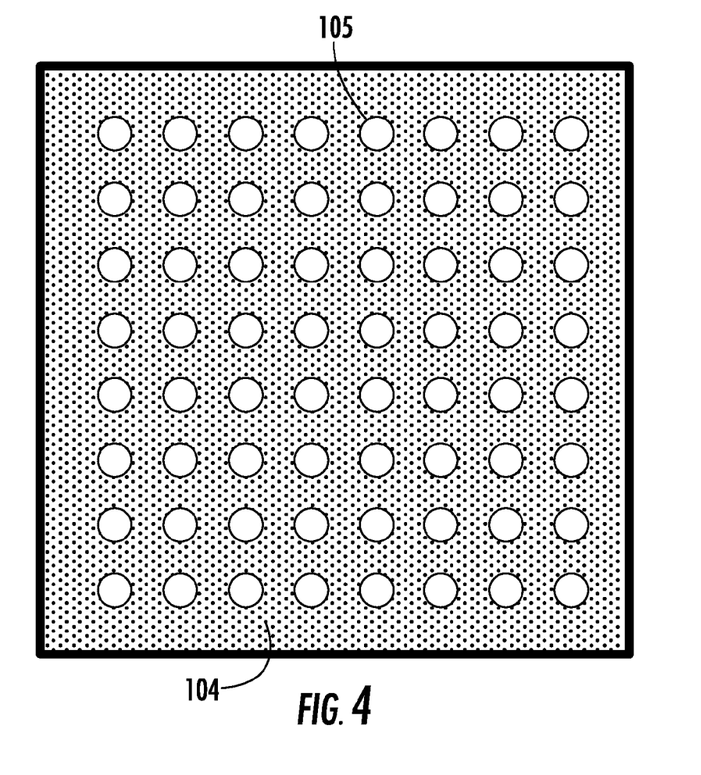
FIG. 4 is a representative mask used to create the n-type back surface fields of FIG. 2.

FIG. 4 represents a mask 104 that may be used to create the n-type back surface field (BSF) 204 of FIG. 2. Use of the mask 104 eliminates process steps compared to alternative hard mask based approaches. Process steps which may be eliminated include forming the masking material, patterning the masking material, and removing the mask after the doping process. As disclosed in the embodiments herein, a later implant may be used to implant others region of the solar cell.

Depending upon the specific doping pattern employed for the solar cell, it may be difficult or impossible to create the p-type emitter region 203, shown in FIG. 2, using a single shadow mask. Therefore, in traditional manufacturing processes, as described above, other techniques, such as hard masks, are used to create the p-type emitter region 203. This may use ion implant, diffusion, or other doping methods with the hard masks or other masking techniques.

Figure 5A:
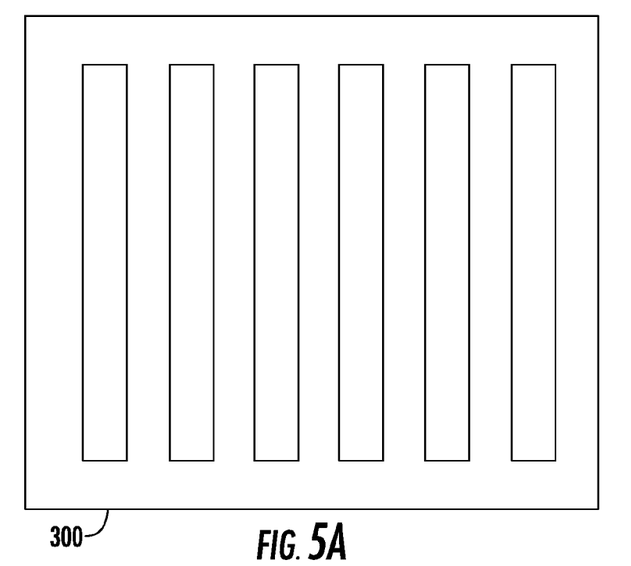
FIG. 5A is a representative mask used to create a portion of the p-type emitter of FIG. 2.
Figure 5B:
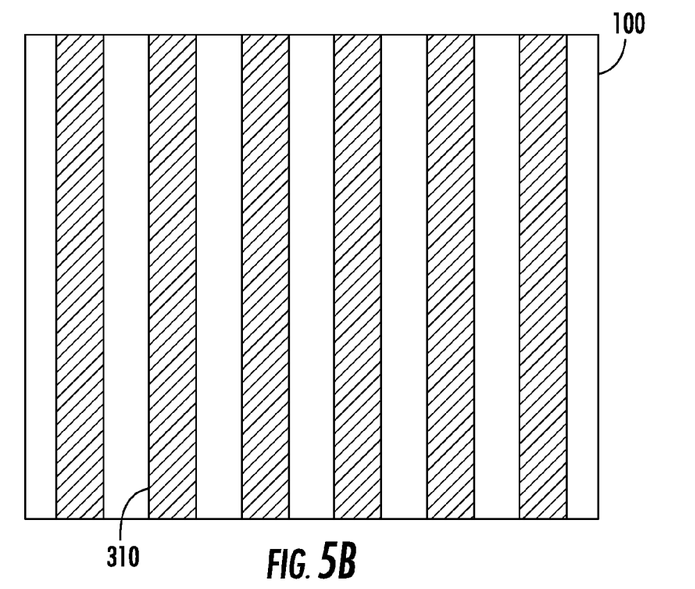
FIG. 5B shows the implanted regions of a substrate following implantation using the mask of FIG. 5A.

Advantageously, the p-type emitter region pattern 203 may be created by repeated use of one or more shadow masks. FIG. 5A shows a shadow mask 300 that may be used to create these emitter regions, while FIG. 5B shows the resulting implanted regions on the substrate. A single use of shadow mask 300 results in a pattern of implanted stripes 310 on the substrate. Following this implant, the shadow mask 300 and the substrate are rotated 90° relative to one another. This can be done by rotating the mask 300, rotating the substrate, or a combination of the both rotations. In some embodiments, the same mask 300 is used for both implants. In other embodiments, a second mask, different than mask 300, is used. Implantation through the multiple masks may be chained or performed without breaking vacuum around the substrate.

Figure 6:
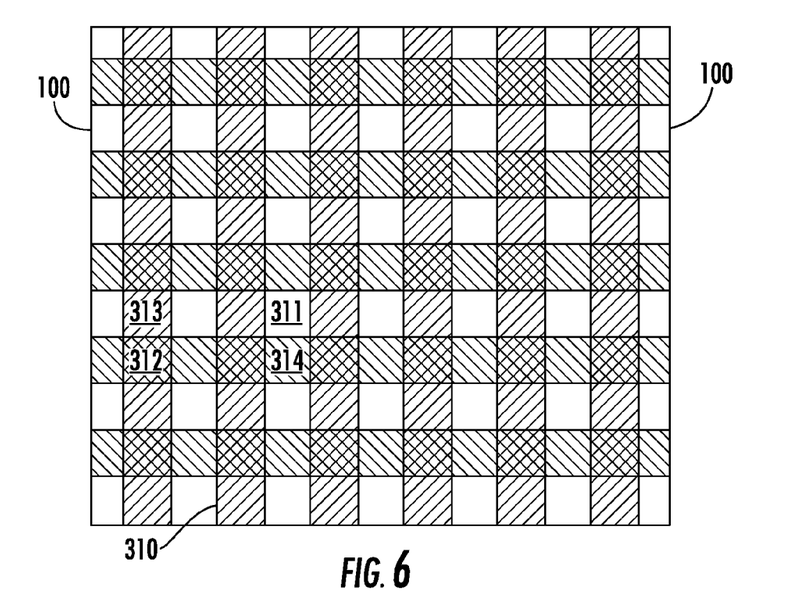
FIG. 6 shows the implanted regions of a substrate following two implants using the mask of FIG. 5A.

FIG. 6 shows the resulting implant pattern on the substrate after a second implant is performed using the rotated mask. Note that the resulting pattern is a checkerboard pattern, which defines four distinct types of regions 311, 312, 313, and 314. Region 311 is defined as those areas that were covered by the mask 300 during both implants and therefore were not doped. Region 312 is defined as those areas which were exposed to the ion beam during both implants. Region 313 is defined as those areas which were implanted only during the first implant, and region 314 is defined as those regions that were only implanted during the second implant.

In some embodiments, the operating parameters, such as species, dose, energy and time duration are identical for the first and second implants. In this embodiment, regions 313, 314 receive an identical dose and are therefore similarly doped. Region 312 has twice the dopant concentration of regions 313, 314 in this scenario. The regions 311 may have zero dose in this scenario. The mask 300 may be aligned during the first and second implant such that the n-type back surface fields 204 are completely within regions 311, resulting in the implant pattern shown in FIG. 7.

Note that this implant pattern closely approximates that shown in FIG. 2. Thus, to produce this implant pattern, a set of steps, shown in FIG. 8, can be used, though other orders of the steps are possible.

Figure 8:
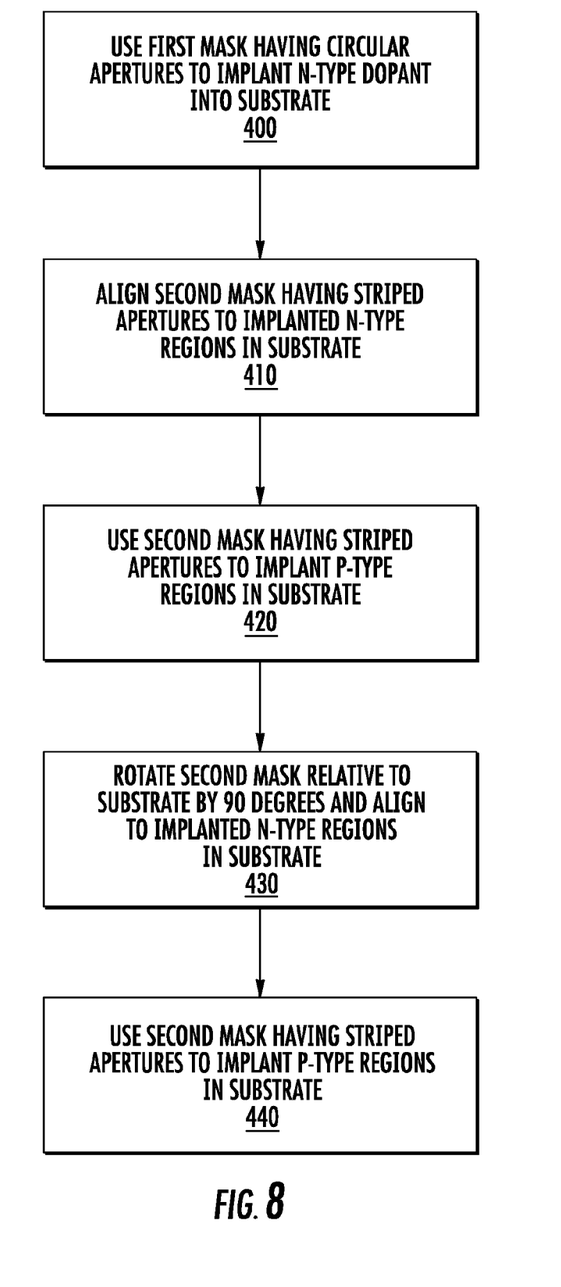
FIG. 8 is a flowchart of a solar cell manufacturing process.

First, in step 400, a mask having a plurality of circular apertures having a diameter in the range from 100 um to 1000 um, corresponding to the n-type back surface fields 204 is used as a shadow mask during the implant of an n-type dopant, such as phosphorus or any other Group V element or molecule. In some embodiments, this implant is performed using the following operating parameters: phosphorus ions having an ion energy of 10 keV, ion dose 2e15 $cm^{-2}$ to yield a n-type dopant concentration ranging from 1e19 to 5e19 $cm^{-3}$ following dopant activation.

Next, as shown in step 410, a second mask having a plurality of apertures forming a striped pattern is used to perform a first implant of a p-type dopant, such as boron or any other Group III element or molecule. The spacing between each aperture in this second mask is preferably greater than the size of the apertures of the first mask, such that the n-type implanted regions fit between the apertures of the second mask. This spacing may be in the range of 500 um to 2000 um. This second mask is aligned to the substrate such that the second mask covers the n-type implanted regions. Once the second mask is aligned, the first implant of p-type dopant is performed, as shown in step 420. The first implant of p-type dopants may use the following conditions: boron ions having an ion energy of 10 kV, ion dose 1e15 $cm^{-2}$ resulting in a dopant concentration following dopant activation of 2e18 to 10e18 $cm^{-3}$.

Next, the mask and substrate are rotated with respect to each other by 90°, as shown in step 430, and aligned so that the n-type implanted regions are still covered by the mask. As stated earlier, a different mask may also be used for this step. In step 440, a second implant of p-type dopant is performed, where the operating parameters and resulting dose may be the same as that of the first p-type implant.

Furthermore, it should be noted that the n-type implant (step 400) may be performed after or in between the p-type implants (steps 420, 440), if desired. This sequence and the use of shadow masks avoids the use of costly and time consuming processes to create an IBC solar cell. These steps may be performed in one or more than one ion implanter. If only one ion implanter is used, then the steps may be performed sequentially without breaking vacuum around the solar cell.

The sequence shown in FIG. 8 may be supplemented with a blanket implant of p-type dopant so as to create a minimum level of p-dopant in the regions 311. This blanket implant may be performed at any point within the sequence shown in FIG. 8. The blanket implant of p-type dopants may use the following conditions: boron ions having an ion energy 10 kV, ion dose ranging from 2e14 to 1e15 $cm^{-2}$ resulting in a dopant concentration following dopant activation of 1e18 to 5e18 $cm^{-3}$. The specific conditions must be chosen such that the dopant concentration in the n-type BSF 204 exceeds the blanket p-type dopant concentration.

This additional blanket implant may be beneficial. For example, this blanket implant insures that the entire surface of the substrate is doped (either n-type or p-type), which serves to reduce recombination of minority carriers. This improves the efficiency of the solar cell.

Figure 7:
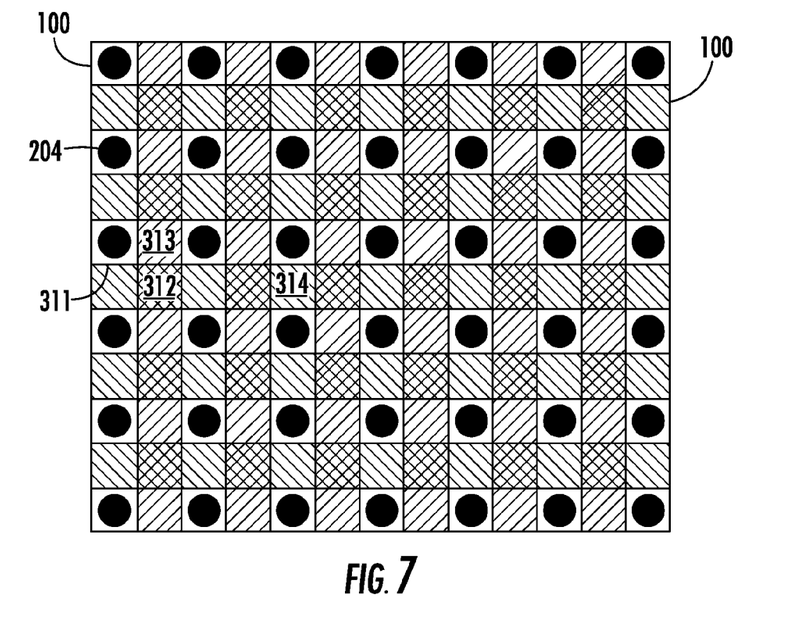
FIG. 7 shows the implanted regions of a substrate including n-type and p-type regions.

In addition, the method described herein may be preferable to a method where a uniformly p-doped emitter region is blanket implanted, and the n-type BSFs are counterdoped. By definition, this method produces a spatially variable doping profile in the emitter. This is beneficial for several reasons. First, a high doping concentration may be realized locally in region 312 which allows for low resistance ohmic contact to the emitter. Second, a lower dopant concentration is realized in regions 312 and 313, which improves efficiency of the solar cell by reducing recombination. Finally, an even lower dopant concentration may be realized in region 311, which can beneficially reduce the probability of shunting between the emitter and BSF. Low doping concentration in region 311 also allows reduction in the required implant dose for counterdoping of the BSF region 204.

The above figures illustrate that, as a portion or region of the substrate is implanted, all locations within that portion receive an identical dose. This may be done be having an ion beam having tight tolerance on collimation, or by having the shadow mask located close to the substrate.

However, in other embodiments, it may be advantageous to have a dopant gradient for the BSF regions 204, and the emitter regions 311, 312, 313, 314. Any ion beam has an inherent spread of angles, such as those due to space charge effect or beam blow up. This spread of angles, or non-collimation means that the transition between implanted and unimplanted regions will not be as abrupt as shown in the FIGS.

Figure 9:
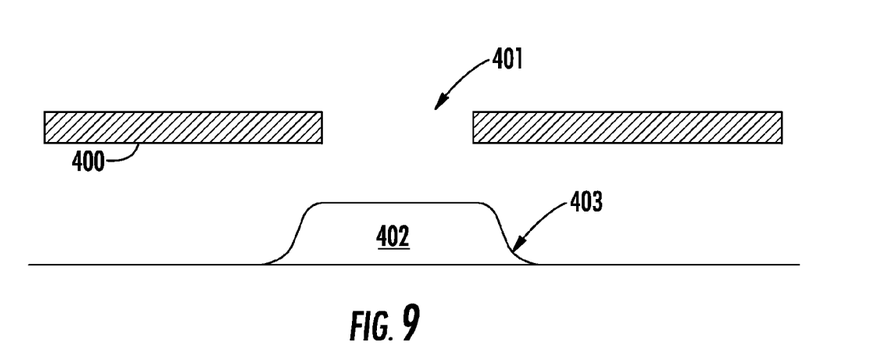
FIG. 9 shows a doping gradient.

FIG. 9 shows a graph showing dose concentration in the substrate versus location of aperture. Above the graph is a mask 400 having an aperture 401 through which the ion beam passes. The region 402 directly beneath the aperture may be implanted with the full dose of ions. However, the areas 403 adjacent to the aperture 401 also are exposed to some amount of ions, due to the non-collimation of the beam. The shape and size of regions 403 may depend on the collimation of the ion beam, as well as the distance between the mask 400 and the substrate. Thus, by varying the distance between the mask 400 and the substrate, or by adjusting the collimation of the ion beam, a doping gradient may be created for all implanted regions of FIG. 7. Furthermore, by varying the angle of incidence of the ion beam relative to the substrate, the shape of the adjacent area 403 on only one side of the aperture may be modified. This gradient may further reduce the abruptness of the p-n junction.

While the present disclosure assumes that the n-type regions are circular while the p-type region is formed as a checkerboard, the disclosure is not limited to this embodiment. For example, the circular implanted regions may be p-type, while the checkerboard pattern may be n-type dopants.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a substrate to create a interdigitated back contact solar cell, comprising:
    implanting a n-type dopant through a first mask having a plurality of first apertures to create a corresponding plurality of n-type doped regions in said substrate;
    performing a first implantation of a p-type dopant through a second mask, said second mask having a plurality of striped apertures, wherein the spacing between a pair of said striped apertures is greater than a size of said first apertures, to create a first plurality of p-doped striped regions in said substrate, wherein said second mask is aligned such that said n-type doped regions are not implanted by said first p-type implantation; and
    performing a second implantation of a p-type dopant through a third mask, to create a second plurality of p-doped striped regions in said substrate, wherein said third mask is aligned such that said n-type doped regions are not implanted by said second p-type implantation;
    wherein said third mask and said second mask comprise a single mask and said second implantation of p-type dopant is performed by rotating said second mask and said substrate 90 degrees relative to each other.

2. The method of claim 1, further comprising performing a blanket implant of a p-type dopant of said substrate.

3. The method of claim 1, wherein said n-type implant is performed after said first and second implants of p-type dopant.

4. The method of claim 1, wherein said n-type doped regions comprise a doping gradient.

5. The method of claim 4, wherein said doping gradient is created by adjusting the distance between said first mask and said substrate.

6. The method of claim 4, wherein said dopants are implanted using an ion beam and said doping gradient is created by adjusting collimation of said ion beam.

7. The method of claim 1, wherein said p-type doped regions comprise a doping gradient.

8. The method of claim 7, wherein said doping gradient is created by adjusting the distance between said second mask and said substrate.

9. The method of claim 7, wherein said dopants are implanted using an ion beam and said doping gradient is created by adjusting collimation of said ion beam.

* * * * *